United States Patent
Kardauskas et al.

(10) Patent No.: US 6,660,643 B1
(45) Date of Patent: Dec. 9, 2003

(54) ETCHING OF SEMICONDUCTOR WAFER EDGES

(75) Inventors: Michael J. Kardauskas, Billerica, MA (US); Bernhard P. Piwczyk, Dunbarton, NH (US)

(73) Assignee: RWE Schott Solar, Inc., Billerica, MA (US)

( * ) Notice: Subject to any disclaimer, the term of this patent is extended or adjusted under 35 U.S.C. 154(b) by 0 days.

(21) Appl. No.: 09/261,616

(22) Filed: Mar. 3, 1999

(51) Int. Cl.[7] .............................................. H01L 21/302
(52) U.S. Cl. ........................ 438/706; 438/710; 438/712
(58) Field of Search ................... 438/689, 706, 438/709, 710, 711, 712; 136/252, 258; 156/345

(56) References Cited

U.S. PATENT DOCUMENTS

| | | | | |
|---|---|---|---|---|
| 3,795,557 A | | 3/1974 | Jacob | |
| 4,141,811 A | * | 2/1979 | Yerkes | 136/89 |
| 4,158,591 A | * | 6/1979 | Avery et al. | 156/345 |
| 4,384,918 A | * | 5/1983 | Abe | 156/345 |
| 4,726,850 A | * | 2/1988 | Wenham et al. | 136/256 |
| 4,748,130 A | * | 5/1988 | Wenham et al. | 437/2 |
| 4,969,416 A | * | 11/1990 | Schumaker et al. | 118/725 |
| 5,156,978 A | * | 10/1992 | Bathey | 438/250 |
| 5,259,923 A | * | 11/1993 | Hori et al. | |
| 5,425,846 A | * | 6/1995 | Koze et al. | 156/345 |
| 5,667,631 A | * | 9/1997 | Holland et al. | 216/13 |
| 5,738,731 A | * | 4/1998 | Shindo et al. | 136/249 |
| 5,767,627 A | * | 6/1998 | Siniaguine | 315/111.41 |
| 5,797,998 A | * | 8/1998 | Wenham et al. | 136/255 |
| 5,827,437 A | * | 10/1998 | Yang et al. | 216/77 |
| 5,877,032 A | * | 3/1999 | Guinn et al. | 438/9 |
| 6,110,274 A | * | 8/2000 | Okuno | 117/81 |
| 6,139,678 A | * | 10/2000 | Siniaguine et al. | 156/345 |
| 6,238,587 B1 | * | 5/2001 | Siniaguine et al. | 216/59 |

FOREIGN PATENT DOCUMENTS

| | | |
|---|---|---|
| WO | WO 92/12273 | 7/1992 |
| WO | WO 92/12610 | 7/1992 |

OTHER PUBLICATIONS

Tru–Si Technologies, *Tru–Si's Solutions*, Oct. 1998.

* cited by examiner

Primary Examiner—Robert Kunemund
Assistant Examiner—Lan Vinh
(74) *Attorney, Agent, or Firm*—Pandiscio & Pandiscio

(57) ABSTRACT

A novel method of etching a plurality of semiconductor wafers is provided which comprises assembling said plurality of wafers in a stack, and subjecting said stack of wafers to dry etching using a relatively high density plasma which is produced at atmospheric pressure. The plasma is focused magnetically and said stack is rotated so as to expose successive edge portions of said wafers to said plasma.

28 Claims, 3 Drawing Sheets

ETCHING OF SEMICONDUCTOR WAFER EDGES

FIELD OF THE INVENTION

This invention pertains to plasma etching of semiconductor wafers and more particularly to the etching of the edges of semiconductor wafers.

BACKGROUND OF THE INVENTION

It is a common practice to etch semiconductor wafers to remove selected material from their front and back surfaces and their edges. Thus etching of silicon has been accomplished in various ways, e.g., by chemical (wet acid) etching, plasma etching, reactive ion etching, ion beam etching and chemically assisted mechanical polishing ("CMP"). It also is common to remove material from wafers by grinding.

Silicon solar cells are commonly made from silicon wafers. These wafers are subsequently subjected to various processing steps to produce solar cells, one of those steps involving formation of a photovoltaic p-n junction adjacent to one side of each wafer. The wafers are formed in different ways. They may be sliced from large single crystal Czochralski-grown boules or polycrystalline blocks, e.g., typically by means of a diamond blade saw or a wire saw. Another common method of producing silicon solar cell wafers is to grow hollow polycrystalline bodies by the Edge-Defined Film-Fed Growth ("EFG") method, and then laser cut those bodies into wafers. Wafers cut from large single crystal boules or polycrystalline blocks are characterized by opposite surfaces that are flat and smooth (sufficiently so that adjacent wafers tend to adhere to one another), while the corresponding surfaces of EFG silicon wafers are uneven. Additionally EFG wafers generally are rectangular in shape, in contrast to those produced from large single crystal boules which commonly have a generally circular configuration (the wafers cut from relatively large cast polycrystalline blocks also are generally rectangular).

EFG semiconductor silicon wafers received from the laser cutting station have edges that have micro-cracks and are tend to be rough due to resolidified material. It has been determined that EFG wafers with micro-cracks at their edges tend to break during subsequent solar cell processing. However, it has been determined that the resistance to fracture of EFG wafers is improved if their edge portions (margins) are etched to give smooth edges that are free of micro-cracks. It should be noted that silicon wafers cut from boules or cast blocks also have edge damage that needs to be removed.

EFG wafers are typically etched using a wet acid etching process, since the other etching techniques mentioned above have not been satisfactory because the etching process throughput rates are too slow and costly. The wet acid etching of EFG wafers serves two purposes: (1) remove edge damage (microcracks) resulting from the laser cutting of the wafers and (2) isotropically remove a thin layer of a film of SiO/SiC that is formed on the back surface of the wafers during the EFG growth process. The etching solution typically is a mixture of nitric and hydrofluoric acids. Using the wet chemical etching process, the EFG-grown wafers are submerged in a bath of the mixed acid solution, with the wafers being kept in the bath long enough to achieve the desired etching.

Although it is effective in improving the resistance to fracture of the EFG wafers, the wet etching process poses other immediate problems. Much floor space is required for the etching equipment and the chemical waste disposal facility. Also the use of the highly corrosive acid mixture poses a continuous hazard. The wet acid etching process also has the disadvantage of producing copious quantities of spent acid which must be neutralized before disposal, and legally disposing of the chemical waste involves substantial cost. Moreover, even with neutralization, an environmental problem remains due to limits on the disposal of the resulting chemical compounds imposed by government authorities.

Prior to this invention it has been deemed desirable to use a plasma etch process to etch the edges of silicon solar cells, after they have been provided with front and back metal contacts, for the purpose of removing sufficient material to assure junction isolation. However, use of a plasma etch process for such purpose is feasible economically only if a plurality of wafers can be etched at the same time and the amount of material required to be removed at each face is relatively small. For effecting junction isolation, the amount of material required to be removed at each edge face typically is in the order of 1 micron. Prior to the present invention it was recognized also that the etch production rate could be increased by stacking a plurality of solar cell wafers together face-to-face in what is commonly called a "coin stack", and then subjecting that stack to a plasma etch process that is conducted in a plasma etching chamber under a partial vacuum, i.e., at sub-atmospheric pressures. Such a process typically produces what is commonly characterized as a relatively low density plasma which envelops the stack. Edge etching a coin stack of solar cells for junction isolation purposes is disclosed by U.S. Pat. No. 4,158,591, issued Jun. 19, 1979 to J. E. Avery et al. and Charles F. Gay For "Solar Cell Manufacture". In the Avery et al. process of making solar cells, the stack of solar cells are enveloped by the reactive plasma for a selected period of time sufficient to achieve the desired junction isolation. The Avery et al patent teaches that the plasma etching may be carried out using plasma etching apparatus as described in U.S. Pat. No. 3,795,557.

Using a reactive plasma in the manner taught by Avery et al. to etch the edges of a coin stack of EFG wafers is not satisfactory for several reasons. For one thing, since a plasma produced under a pressure that is less than atmospheric pressure tends to have a relatively low density, the rate of removal of wafer material is comparatively low. That limitation is especially severe in the case of edge etching EFG wafers since the amount of material required to be removed at each edge face to eliminate the micro-cracks is substantially in excess of one (1) micron. EFG silicon wafers currently being used to make solar cells frequently have micro-cracks or roughness due to resolidified material that require as much as 100 microns to be removed from each edge.

A second reason is due to the nature of the EFG wafers. As noted above, the opposite faces of EFG wafers are uneven. More specifically, the surfaces of EFG wafers have undulations that are clearly visible and result in surface flatness deviations of as much as 500 microns. Because of those undulations, and also because of the roughness at the edges caused by resolidified material, when EFG wafers are arranged in a coin stack, they do not adhere to one another and instead there may exist small gaps therebetween into which the reactive plasma can intrude. In this connection it is to be noted that the mean free path of the reactive ions (e.g., fluorine ions) in an etching plasma depends on the density and pressure of the plasma. Under the partial pressures created in the etching chamber, the mean free path of the reactive ions in the plasma surrounding a stack of wafers is such that the ions can travel in the order of millimeters between adjacent EFG wafers, causing uneven etching of the opposites surfaces of each wafer as well as uneven etching of the edge faces of the same wafers.

OBJECT AND SUMMARY OF THE INVENTION

The primary object of this invention is to provide a new method of etching the edges of semiconductor blanks for the purpose of removing damaged edge portions.

Another specific object of the invention is to provide a method of edge-etching semiconductor wafers that are stacked together, with the coin stack being exposed to a reactive plasma in a manner that removes edge damage from the wafers, while limiting the etching substantially to the edges of the wafers.

Another object is to provide a novel method which involves supporting a plurality of semiconductor wafers in a stack and moving that stack so that successive edge portions of the wafers are etched to within predetermined tolerances.

Still another object is to provide a novel method of edge etching semiconductor wafers for use in making solar cells or other semiconductor devices.

A more specific object is to provide an improved method of making solar cells that is characterized by a novel technique for edge etching the wafers to remove microcracks.

A further specific object is to provide an improved method of edge etching EFG wafers so as to removed damaged portions from said wafers.

These and other objects are achieved by a process which comprises subjecting semiconductor wafers to dry etching using a relatively high density plasma which is produced at atmospheric or near-atmospheric pressure. More particularly the invention comprises etching the edges of a stack of wafers using apparatus like or similar to the plasma apparatus disclosed in U.S. Pat. No. 5,767,627, issued Jun. 16, 1998 to O. Siniagnine for Plasma Generation And Plasma Processing Of Materials.

Other features and advantages of the invention are presented by the following detailed description which is to be considered together with the attached drawings.

SPECIFIC DESCRIPTION OF THE INVENTION

The present invention is based on the concept of using a plasma generator of the type described in U.S. Pat. No. 5,767,627 which operates at atmospheric or near atmospheric pressure and produces a plasma which has a density that is high in relation to the density of the plasma produced by the apparatus described in U.S. Pat. No. 3,795,557. However a plasma generator of the type described in said U.S. Pat. No. 5,767,627 produces a magnetically confined plasma stream. Accordingly the plasma generator needs to be positioned so that its magnetically confined plasma stream is directed at the edges of the wafers in the stack of wafers to be etched. The invention also recognizes that the magnetically controlled plasma cannot be directed simultaneously at all edges of the wafers in a given stack of wafers. Therefore, the method of this invention also involves rotating the coin stack so as to expose different edges of the wafers (or different edge portions in the case of circular wafers) to the plasma stream. The time of exposure of the wafer edges to the plasma stream is controlled so as to avoid overheating the wafers, since overheating produces undesirable results.

Figure 1:
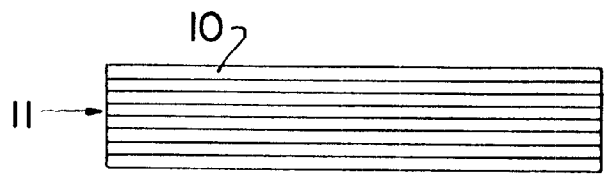
FIG. 1 is a plan view illustrating a stack of rectangular semiconductor wafers.
Figure 2:
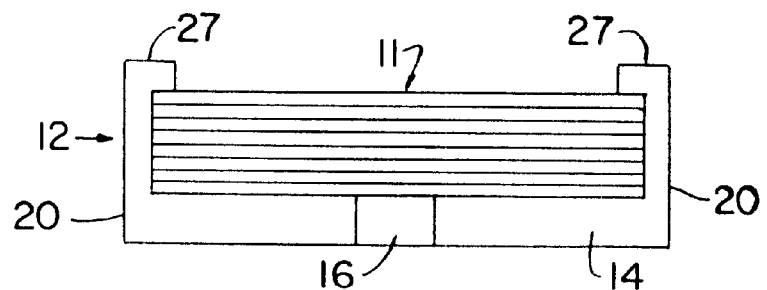
FIG. 2 is a plan view showing the same stack of wafers supported by a clamping type holder.
Figure 3:
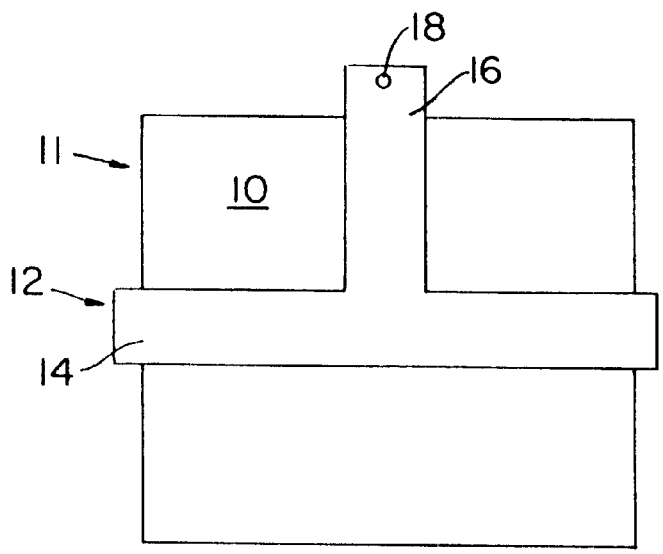
FIG. 3 is a rear elevation of the wafer holder shown in FIG. 2.

Referring first to FIGS. 1–3, a plurality of rectangular wafers 10 are mounted face-to-face in a stack 11, and that stack is disposed in and supported by a holder 12. It should be noted that the wafer thickness is exaggerated in FIGS. 1, 2 and 4–6 for convenience of illustration. The holder 12 preferably comprises a main strap portion 14, a supporting arm portion 16 which is joined to the center of strap portion 14 and has a hole 18 at its upper end which is used to attach it to a hanger (not shown), and a pair of arms 20 at opposite ends of strap portion 14, with arms 20 terminating in right-angle flanges 22. As a result, as seen in FIG. 2, the members 14, 20 and 22 cooperate to define a space for receiving the stack of wafers. The two arms 20 engage the adjacent edges of the wafers. In this particular embodiment of the invention, the arms 20 are made of a spring metal and are formed so that together they exert a clamping force on the wafers that is just sufficient to hold the wafers in place without incurring any wafer damage. The wafers are held only at two opposite edges (the vertically-extending edges as viewed in FIGS. 3, 5 and 6), leaving the other two edges (the horizontally-extending edges as viewed in FIGS. 3, 5 and 6) fully exposed so that they can be etched as hereinafter described.

Figures 4, 5:
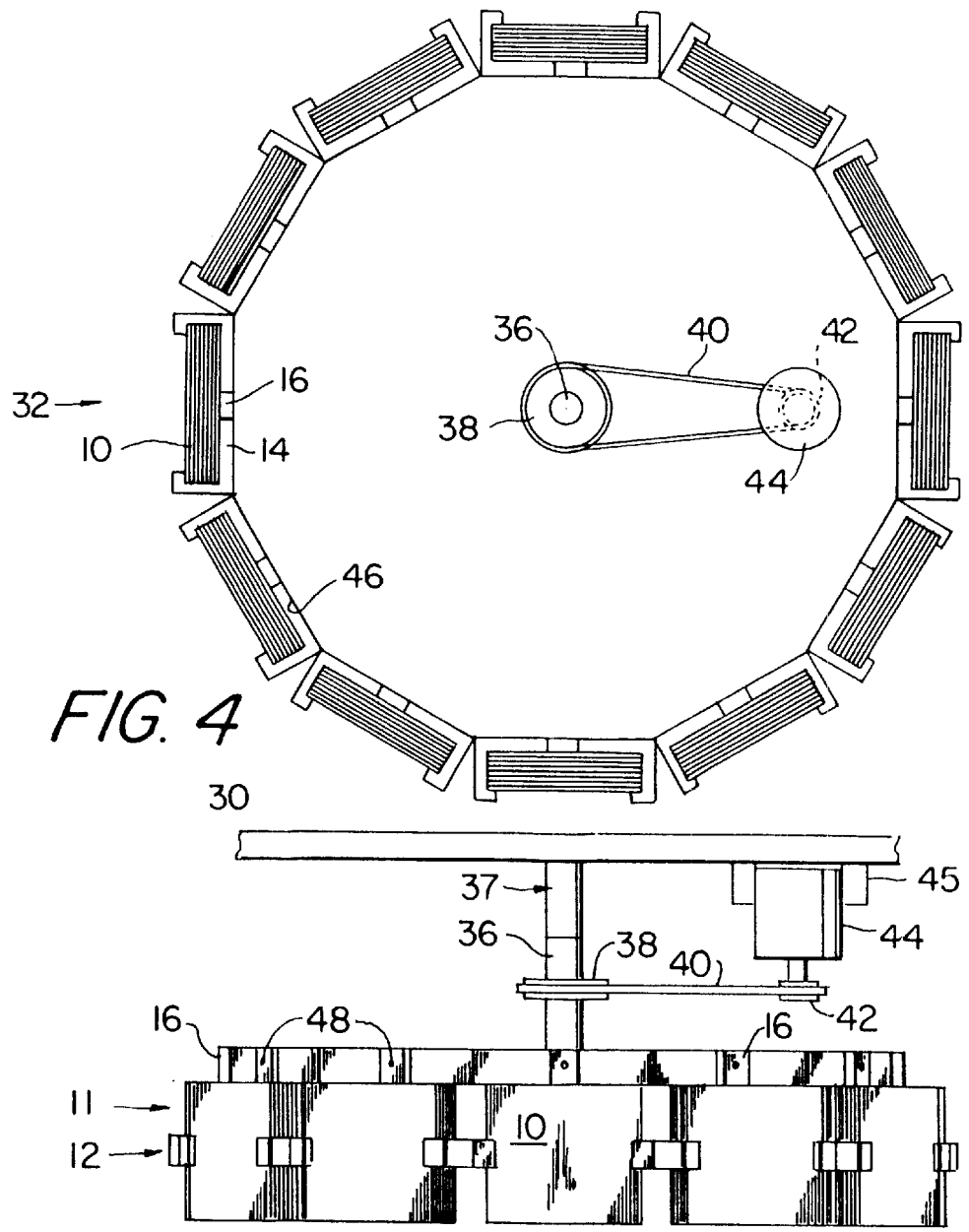
FIG. 4 is a schematic plan view of a carousel for transporting a plurality of stacks of wafers into and out of an etching plasma.
FIG. 5 is a schematic side elevation of the same carousel.
Figure 6:
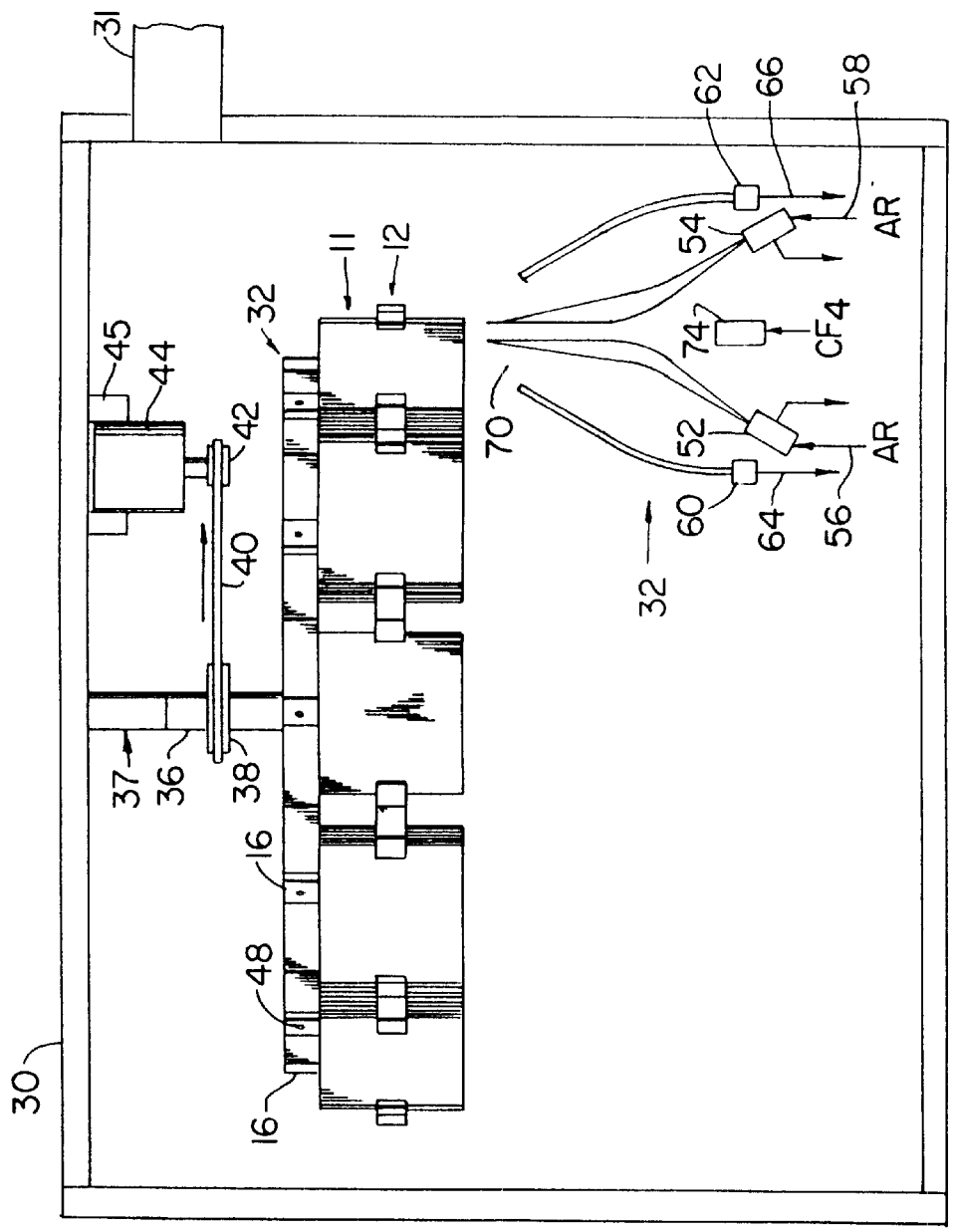
FIG. 6 is a schematic view illustrating a plasma generating system adapted to produce a high density plasma in combination with the carousel of FIGS. 4 and 5, and showing how a stack of wafers is exposed to the etching plasma.

Turning now to FIGS. 4–6, there is shown one form of apparatus for etching stacks of wafers according to this invention. The apparatus comprises a housing 30 that defines an etching chamber containing a carousel 32 and a plasma generator identified generally by the numeral 34. Carousel 32 is carried by a rotatable shaft 36 which is mounted to a bearing support 37 that is affixed to the housing. Mounted on shaft 36 is a pulley 38 that is coupled by a belt 40 to a second pulley 42 that is mounted on the output shaft of an electric motor 44. The latter is mounted to a motor support 45 affixed to housing 30. Operation of motor 44 will cause pulleys 42, belt 40 and pulley 38 to rotate the carousel in a direction determined by operation of motor 44.

Carousel 32 has an a polygonal configuration in plan view, comprising a plurality of flat facets 46 (FIG. 4) that are provided with hangars in the form of pins 48 (FIGS. 5,6) that are sized to fit in holes 18 of holders 12. The facets and pins 48 serve to permit a plurality of holders 12, each supporting a stack of wafers to be etched, to be attached to the carousel, one at each facet of the carousel.

Referring now to FIG. 6, the plasma generator identified generally by numeral 34 comprises two hollow electrode units 52 and 54 which also serve as discharge nozzles, their internal passageways (not shown) being connected by lines 56 and 58 to a supply of at least an inert gas such as argon.

The two electrode units are disposed so that their axes are disposed in converging relation with one another, with the result that the gas streams emitted by them converge on one another in the manner shown in FIG. 1 of said U.S. Pat. No. 5,767,627. The plasma generator also comprises at least a pair of electromagnets represented schematically at 60 and 62, and electrical leads 64 and 66 for connecting the electrodes and electromagnets to power supplies (not shown), plus other associated components (not shown) that complete and operate electrical circuits for (a) energizing the electrode units so as to pass an electrical current through and between the two inert gas streams and thereby form a plasma stream, and (b) energizing the electromagnets so as to create magnetic fields for shaping the plasma. Other details of the plasma generator are not shown herein and instead the teachings of said U.S. Pat. No. 5,767,627 are incorporated herein by reference thereto. In this connection it is to be appreciated that other forms of plasma generators that operate at or near atmospheric pressure, e.g., the plasma generators disclosed by the several patents and PCT patent applications listed in said U.S. Pat. No. 5,767,627, may be used in practicing the present invention. By way of example but not limitation, the power supply for the electrode units may provide a d.c. voltage in the range of 100 to 200 volts when the distance between the centers of the discharge orifices of the two adjacent electrode units is in the range of 20 to 100 mm and the angle between the electrode units is in the range of 30° to 50°.

Thus, further by way of example but not limitation, the power supply for the two electrode units may be such as to generate a plasma current in the order of 90 amperes. The plasma has the appearance of a flame, as represented at 70 in FIG. 6, and reaches a maximum temperature in the order of thousands of Centigrade degrees in the region where the current arcs between the two gas streams emitted by the two electrode units.

The plasma generator is disposed below the carousel and is positioned so as to direct the gas streams upwardly at the periphery of the carousel. Consequently as the carousel rotates each stack of wafers in turn will pass over the plasma flame produced by generator 34. The carousel and plasma generator are disposed so that the bottom edges of the wafers in each of the stacks that are mounted to the carousel are spaced approximately 45 cm. above the level of the gas discharge ends of the two electrode units. This gap between the stack of wafers in etching position and the discharge ends of the two electrodes assures that the wafers will be in a downstream plasma zone that is characterized by a relatively low temperature (in the order of 500° C.) rather than in the much higher temperature zone where the current arcs between the two gas streams emitted by the electrodes. This spacing between the plasma generator and the wafers carried by the carousel helps assure that the wafers will not be overheated.

A selected gas that serves as the source of a desired reactive species, i.e., the ions that react with the wafers so as to chemically etch their edges, may be introduced with the inert gases through the internal passageways of the electrode units, so that the gas streams emitted from the discharge nozzles of the electrode units contain both an inert gas and the desired reactive species, e.g., fluorine ions. Alternatively or additionally, the gas that serves as the source of the desired reactive species may be introduced directly into the plasma via an injection tube 74 which corresponds to the injection tube 21 shown in said U.S. Pat. No. 5,767,627. As suggested by said U.S. Pat. No. 5,767,627 (col. 4, lines 10–15), the injection tube is located below and is spaced at a distance from the point of intersection of the axes of the two electrode units where it is not likely to experience thermal damage by the plasma heat during operation of the plasma generator. U.S. Pat. No. 5,767,627 suggests that in some embodiments the distance between the discharge end of the injection tube and the point of intersection of the axes of the two electrodes may be as much as 10–50 mm.

In practicing this invention it is preferred that the gases introduced via the electrode units consist of only inert gases and that the reactive species be introduced solely via injection tube 64. The reason for this preferred way of introducing the reactive species is that it is easier to control the concentration of reactive species in the downstream plasma zone where the plasma contacts the wafers. By way of example but not limitation, the inert gas may be argon flowing through each of the two electrodes at a rate in the order of one (1) liter per minute, while the reactive species introduced via injection tube 12 may be $CF_4$ flowing at a rate in the order of 2.5 liters per minute.

Various compounds may be used as the source of the reactive species that etches the wafers. In the case of silicon wafers, the source is a halogen-containing compound, preferably one that contains fluorine. By way of example but not limitation, for etching silicon the source of the reactive species comprise one or more of the following in gaseous form: carbon tetrafluoride ($CF_4$), trifluoromethane ($CHF_3$), difluoromethane ($CH_2F_2$), fluorine, fluoroform, hexafluoroethane, hydrogen bromide, hydrogen fluoride, iodine pentafluoride, tetrafluoroethylene, trichlorofluoromethane, bromine pentafluoride, bromine trifluoride, bromotrifluoroethylene, bromotrifluoromethane, chlorodifluoromethane, chloropentafluoroethane, chlorotrifluoroethylene, chlorotrifluoromethane, dibromodifluoromethane, 1,2-dibromotetrafluoroethane, dichlorodifluoromethane, dichlorofluoromethane, 1,2-dichlorotetrafluoroethane, 1,1-difluoro-1-chloroethane, 1,1-difluoroethane, 1,1-difluoroethylene, tetrafluoroethylene, and trichlorofluoromethane.

The gas introduced to the electrode units for creating the plasma preferably is an inert gas such as argon or helium, or a mixture thereof, although any other gas capable of sustaining an electrical current may be used to create the plasma, provided, of course, that such gas does not have a deleterious effect on the wafers or the components, operation or operating results of the plasma generator.

Following is a specific example of how to practice the invention using apparatus as shown in FIGS. 2–6. A plurality of rectangular EFG wafers, each measuring 4 inch×4 inch and having a thickness of approximately 300 microns (300 μm), are arranged in face-to-face contact in a plurality of stacks, with each stack being placed in a holder 12. Each holder supports a stack of 85 wafers. The stacks are mounted on the facets 46 of the carousel, with the arm portions 16 of the holders 12 being suspended from hanger pins 48. The carousel has 12 facets, so that in excess of 1000 wafers are supported at its periphery. The housing 30 is not air-tight and thus the pressure in the chamber defined by the housing is atmospheric. The housing is provided with an exhaust line 31 that may be coupled to an exhaust fan (not shown) to assure removal of spent gases.

Argon gas is introduced to the two electrode units at a rate of approximately 0.8 liter/minute and $CF_4$ gas is introduced via injection tube 64 at a rate of 2.5 liters/minute. The plasma generator is energized with a d.c. voltage so as to provide an electrical current of approximately 90 amperes to arc between the two gas streams emanating from the two electrodes, resulting in the formation of a plasma containing ions of fluorine. The flow velocity in the downstream plasma region, i.e., the relatively cold plasma zone through which the bottom edges of the wafers are transported, is less than 30 meters/second.

Rotation of the carousel is initiated before or substantially at the same time that the plasma generator is energized to create the plasma. The carousel is rotated at a linear speed of about 120 inches/second, so that each stack of wafers is exposed to the plasma for a period on the order of milliseconds, thereby preventing overheating of the wafers. Under the foregoing conditions, the etch rate is in the range of 50–75 $cm^2$/sec./$\mu$m. The carousel operates continuously until the bottom edges of all of the wafers on the carousel have been etched a desired amount, e.g., their bottom edges are etched back by about 35 $\mu$m. Then the carousel is stopped, the flow of gases is terminated and the flow of electrical power to the plasma generator is shut off. Thereafter the wafers are allowed to cool and then removed from the chamber. The wafers are then reversed 180° in holders 12, so that what were previously the wafer top edges are now the wafer bottom edges, and the wafer-containing holders are then mounted again to the carousel. The etching process is then repeated to etch the new bottom edges of the wafers. Subsequently the process is terminated again, the wafer holders are removed from the chamber and the wafers rotated 90° in their holders. Then the holders are again mounted in the carousel and the etching process is repeated. Subsequently, the process is terminated a third time, the wafer holders removed, and the wafers rotated 180° in the holders. Then the holders are again mounted on the carousel and the process repeated to etch the fourth edges of the wafers.

Wafers etched in the manner described by the foregoing example have been found to have improved resistance to fracture during subsequent solar cell manufacturing steps. Additionally the process of this invention offers the advantage that the throughput of wafers is as high or higher than it is using wet acid etching. Also waste disposal problems are substantially reduced and the overall cost of etching is substantially less than wet acid etching.

It is contemplated that the process may be modified by providing the carousel with wafer holders that are capable of rotating on axes that are perpendicular to the facets of the carousel and have a first set of grippers for gripping a stack of rectangular wafers at first and second opposite edges of the wafers and a second set of grippers for gripping same wafers at their other two opposite edges, with the carousel also being provided with means operable on command for selectively and alternately operating the two sets of grippers and for rotating the wafer holders in 90° or 180° increments so that each of the edges of the wafers is exposed in turn to the etching plasma.

The invention is not limited to etching EFG silicon wafers. Instead the invention may be used to etch the edges of wafers cut from single crystal boules or from polycrystalline blocks made by casting or some other process. Also the invention is not limited to etching wafers that have a rectangular shape. By way of example, the invention may be used to etch the edges of a stack of circular wafers, in which case the carousel is modified to include (a) wafer holding means that are adapted to grip the circular wafers at their centers rather than their edges, and (b) means for rotating the wafer holding means so that successive portions of the edges of the circular wafers are exposed to the plasma flame.

Another contemplated modification is to modify the wafer holders 12 and the carousel by providing modified wafer stack holders that have a center axis for rotation and providing the carousel with (a) means on each of its facets for rotatably and removably supporting the modified holders and (b) detent means for releasably holding each wafer stack holder in a selected rotational position. With such apparatus, rotation of the holders carrying the wafers in 90° increments may be effected by means of a manually manipulated tool (not shown) or a manually operated mechanism (also not shown) that is carried by the turntable. Another possible modification is to use more than two electrodes to shape the plasma stream, as suggested by said U.S. Pat. No. 5,767,627.

It also is recognized that the reactive gas, e.g., $CF_4$ gas injected via tube 64, may be admixed with an inert carrier gas such as argon. Also, if desired, a mixture of reactive gases may be introduced to the plasma for the etching purposes. It also is appreciated that the method of this invention may be used to edge etch wafers may of a material other than silicon and that in such case, the same or other gaseous etchant materials may be used in practicing the invention.

It is contemplated that the edge etching method herein described and claimed forms an integral part of a solar cell manufacturing process which comprises the following conventional steps: (1) growing a hollow polycrystalline body of silicon by the EFG method, e.g., a so-called "octagon", (2) severing the hollow body with a laser so as to form a plurality of rectangular wafers, (3) edge etching the wafers as herein described, (4) subjecting the wafers to diffusion doping so as to form photovoltaic junctions therein, and (5) forming metal contacts on the front and back surfaces of the wafers so as to form operative solar cells. Except for the edge etching operation, the foregoing process for making solar cells comprises steps that are old in the art and hence need not be described in greater detail herein. In this connection see the following U.S. Patents which are incorporated herein by reference: U.S. Pat. No. 5,476,553, issued to J. I. Hanoka et al.; U.S. Pat. No. 5,270,248, issued to M. D. Rosenblum et al.; U.S. Pat. No. 5,102,494, issued to D. S. Harvey et al; and U.S. Pat. No. 5,156,978, issued to B. R. Bathey et al.

Still other modifications and applications of the invention will be obvious to persons skilled in the art from the foregoing specific description.

What is claimed is:

1. Method of etching the edges of a plurality of like semiconductor wafers of rectangular configuration for the purpose of removing micro-cracks at said edges, said method comprising assembling said plurality of wafers face-to-face in contact with each other so as to form a coin stack with the wafers having their edges in mutual alignment, providing a reaction chamber containing a plasma generator characterized by at least a pair of hollow gas discharge electrodes that are disposed adjacent one another and arranged so that gas streams discharged therefrom will converge on one another, forming a reactive plasma comprising reactive halogen ions by discharging converging gas streams from said electrodes and energizing said electrodes so as to create an electric discharge between said converging gas streams while the pressure within said chamber is at the level of atmospheric pressure, said reactive plasma comprising a first zone above and spaced from the region of said electrodes and said electric discharge that is characterized by a temperature in the order of 500° C. and a second zone below said first zone and proximate the region of said electrodes and said electric discharge that is characterized by a temperature substantially greater than the temperature of said first zone, positioning said coin stack in said chamber above said electrodes so that said wafers extend vertically and first edges of said wafers face down and extend to the level of said first zone but short of the level of said second zone, continuously moving said coin stack so that said first edges move in and out of said first zone repetitively and continuously with the time duration of each transit of said first edges in said first zone being limited so that said first edges are etched incrementally by reaction with said halogen ions, terminating movement of said coin stack, removing said coin stack from said chamber, reorienting said coin stack and repositioning said coin stack in said chamber above said electrodes so that said wafers still extend vertically but other edges of said wafers face down, continuously moving said coin stack so that said other edges move in and out of said first zone repetitively and continuously with the time duration of said other edges in said first zone being limited so that said other edges are etched incrementally by reaction with said halogen ions, and then terminating movement of said coin stack and removing said coin stack from said chamber.

2. Method according to claim 1 wherein said wafers consist of polycrystalline semiconductor silicon and are free of any p-n junctions.

3. Method according to claim 1 wherein said halogen ions are fluorine ions.

4. Method according to claim 1 wherein said time duration of said each transit is in the order of milliseconds.

5. Method according to claim 1 wherein said reactive halogen ions are produced by passing another gas stream comprising a gaseous halogen compound into said region of electric discharge.

6. Method according to claim 5 wherein said wafers are polycrystalline silicon wafers and said gaseous halogen compound is supplied to said region at a rate in the order of 2.5 liters/minute.

7. Method according to claim 1 wherein said reactive halogen ions are produced by introducing a gaseous halogen compound into said region of electric discharge as a component of one of said gas streams.

8. Method according to claim 7 wherein said halogen compound is $CF_4$.

9. Method of etching edges of a plurality of planar silicon semiconductor wafers having opposite faces and edge portions that are characterized by micro-cracks, said method comprising assembling said plurality of wafers into a plurality of coin stacks with the wafers in each stack being assembled face-to-face in contact with one another and with their edges in mutual alignment, supporting said stacks in a circular array on a carousel in an etching chamber with said coin stacks oriented so that said opposite faces extend vertically and selected edge portions of said wafers face downward, creating a reactive plasma containing halogen ions in a selected region of said chamber below said carousel and said coin stack while said chamber is at substantially atmospheric pressure by introducing first and second converging gas streams into said chamber and creating an electric discharge between said gas streams in the presence of a halogen-containing compound, and rotating said carousel in said chamber in proximity to said region so that said selected edge portions of the wafers in each stack repetitively move into and out of said plasma with said selected edge portions being in said plasma for only a limited time during each transit through said plasma, whereby said selected edge portions undergo etching by contacting said plasma on an intermittent basis.

10. Method according to claim 9 wherein said limited time is in the order of milliseconds.

11. Method according to claim 9 wherein said plasma is magnetically shaped.

12. Method according to claim 9 wherein said halogen ions are provided by introducing a gaseous halogen-containing compound to said electric discharge region at a rate in the order of 2.5 liters/minute.

13. Method according to claim 9 wherein said wafers have a rectangular shape, and further wherein said carousel is stopped after said selected edge portions of the wafers in said plurality of coin stacks have been etched to remove micro-cracks, each of the coin stacks carried by said carousel is rotated so that their opposite faces still extend vertically but other edge portions of the wafers in said each stack face downward, and thereafter rotation of said carousel is resumed so that said other edge portions of the wafers in said each stack repetitively move into and out of said plasma for a limited time, whereby other edge portions of said wafers undergo etching by contacting said plasma on an intermittent basis.

14. Method according to claim 9 wherein said gas streams are discharged from nozzles which direct them upwardly, and further wherein said plasma comprises a first zone above and spaced from said nozzles that is characterized by a temperature in the order of 500° C. and a second zone below said first zone and proximate the region of said electric discharge that is characterized by a temperature substantially greater than the temperature of said first zone, and further wherein said carousel is located so that said coin stacks are spaced vertically from said nozzles with said selected edge portions extending to the level of said first zone but not the level of said second zone.

15. Method according to claim 9 wherein each wafer coin stack is supported in a separate holder that is releasably attached to said carousel.

16. Method according to claim 15 wherein periodically exposure of said coin stacks to said plasma is interrupted to permit each coin stack to be rotated 90° or 180° in its holder, whereby other edge portions of said wafers undergo etching by contacting said plasma on an intermittent basis.

17. Method of edge etching a plurality of semiconductor wafers wherein each wafer has four side edges with portions of wafers at said edges having micro-cacks, said method comprising the following steps:

(a) assembling said plurality of wafers in face-to-face contact with each other so as to form a coin stack with the edges of each wafer aligned with the edges of adjacent wafers;

(b) positioning said coin stack so that said wafers extend vertically and the wafer edges along a first side of said coin stack are facing down;

(c) repetitively and continuously moving said first side of said coin stack into and out of contact with a reactive plasma stream containing halogen ions that is produced at atmospheric pressure by passing an electric current through at least two converging gas streams discharged by separate electrode nozzles located below said coin stack, whereby to etch away wafer edge portions along said first side having micro-cracks, each contact with said reactive plasma stream being for a period of time in the order of milliseconds;

(d) repositioning said coin stack so that the wafers still extend vertically but the wafer edges along a second side of said coin stack are facing down;

(e) repetitively and continuously moving said second side of said coin stack into and out of contact with a reactive plasma stream containing halogen ions that is produced at atmospheric pressure by passing an electric current through at least two converging gas streams discharged by separate electrode nozzles located below said coin stack, whereby to etch away wafer edge portions along said second side having micro-cracks, each contact with said reactive plasma stream being for a period of time in the order of milliseconds;

(f) repositioning said coin stack so that the wafers still extend vertically but the wafer edges along a third side of said coin stack are facing down;

(g) repetitively moving said third side of said coin stack into and out of contact with a reactive plasma stream containing halogen ions that is produced at atmospheric pressure by passing an electric current through at least two converging gas streams discharged by separate electrode nozzles located below said coin stack, whereby to etch away wafer edge portions along said third side, each contact with said reactive plasma stream being for a period of time in the order of milliseconds;

(h) repositioning said coin stack so that the wafers still extend vertically but the wafer edges along a fourth side of said coin stack are facing down; and (i) repetitively moving said fourth side of said coin stack into and out of contact with a reactive plasma stream containing halogen ions that is produced at atmospheric pressure by passing an electric current through at least two converging gas streams discharged by separate electrode nozzles located below said coin stack, whereby to etch away wafer edge portions along said fourth side, said contact with said reactive plasma stream being for a period of time in the order of milliseconds.

18. Method of edge etching a plurality of planar semiconductor wafers so as to remove edge portions thereof that are characterized by micro-cracks, said method comprising assembling said plurality of wafers in a plurality of coin stacks with the wafers in each stack being in face to face contact in edge alignment with one another, supporting said stacks on a carousel in an etching chamber, with said carousel having a vertical axis of rotation and said coin stacks disposed in a circular array centered on and spaced from said axis of rotation and with said wafers oriented so that they extend vertically and certain of their edge portions face downwardly, generating a reactive plasma zone in a selected region of said chamber below said carousel and said coin stacks while maintaining the pressure within said chamber at the level of substantially atmospheric pressure, continuously rotating said carousel so that each stack in turn passes through said region with said selected edge portions of the wafers in said each stack repetitively contacting said plasma in said plasma zone for a limited time in the order of milliseconds, whereby to etch said edge portions to eliminate said micro-cracks, terminating rotation of said carousel after said microcracks have been eliminated, and removing said coin stacks from contact with said plasma after said micro-cracks have been eliminated.

19. Method of edge etching semiconductor wafers for the purpose of removing edge portions thereof that have micro-cracks, said method comprising assembling a plurality of coin stacks of said wafers, with each coin stack comprising a plurality of said wafers disposed in face-to-face contact and in edge alignment with one another, positioning said plurality of coin stacks in a circle about a vertical axis of rotation with said stacks arranged so that the wafers extend vertically and so that selected edges of the wafers in each stack face downward, generating a reactive plasma in a reaction chamber by creating an electric discharge through first and second mutually converging gas streams at substantially atmospheric pressure in the presence of a halogen-containing compound, said plasma having a first relatively high temperature zone adjacent to and above said electric discharge and a second relatively low temperature zone immediately above said first relatively high temperature zone, rotating said array of coin stacks about said axis of rotation at a level above the level of said converging gas streams so that said selected edges of the wafers in said each coin stack are transported repeatedly and continuously into and out of said second relatively low temperature zone above the level of said first relatively high temperature zone, whereby portions of each wafer may be etched away incrementally at said selected edges by reaction with said plasma, terminating rotation of said array of coin stacks after said micro-cracks have been removed by etching away portions of said wafers at said selected edges, and thereafter terminating exposure of said wafers to said plasma.

20. Method of edge etching a plurality of rectangular semiconductor wafers having first, second, third and fourth side edges defining a rectangular edge configuration for the purpose of removing edge portions thereof that have microcracks, said method comprising assembling said plurality of wafers face-to-face in contact with each other so as to form a coin stack with their edges in mutual alignment, creating a reactive plasma in a reaction chamber at substantially atmospheric pressure by creating an electric discharge through at least two upwardly directed converging gas streams, and positioning said coin stack in said chamber above the level of the region of said electric discharge with said wafers extending vertically and said first side edges facing down, continuously moving said coin stack horizontally in a circular path so that substantially said first side edges of said wafers are repetitively exposed to and are contacted by said plasma above said region of electric discharge for a limited time duration during each cycle of movement thereof along said circular path, whereby said portions of said wafers along said first side edges are etched away incrementally by said plasma, removing said coin stack from said chamber, repositioning said coin stack in said chamber above the level of the region of said electric discharge with said wafers extending vertically but said second side edges facing down, continuously moving said coin stack horizontally in a circular path so that substantially only said second side edges of said wafers are repetitively exposed to and are contacted by said plasma above said region of electric discharge for a limited time duration during each cycle of movement thereof along said circular path, whereby portions of said wafers along said second side edges are etched away incrementally by said plasma, and repeating the foregoing process so that said third and fourth side edges in turn a,-e repetitively exposed to and are contacted by said plasma above said region of electric discharge for a limited time duration, whereby portions of said wafers along said third and fourth side edges are etched away incrementally by said plasma.

21. Method according to claim 20 wherein said wafers are polycrystalline silicon wafers produced by the EFG process and do not have any p-n junction, and further wherein said plasma is in the form of an upwardly flowing stream.

22. Method of edge etching planar semiconductor wafers for the purpose of removing edge portions thereof that have micro-cracks, said method comprising assembling a plurality of coin stacks of said wafers, with each coin stack comprising a plurality of said wafers disposed in face-to-face contact and in edge alignment with one another, mounting said coin stacks on a carousel so that said coin stacks form a circular array and with said coin stacks oriented so that said each wafer extends in a vertical plane, and continuously and repetitively rotating said carousel above a reactive halogen ion-containing plasma stream produced and maintained at atmospheric pressure by an electric discharge between converging gas streams so that each stack in turn moves into and out of etching relation with said plasma stream with selected edge portions of the wafers in each stack being etched incrementally during each revolution of said carousel, stopping rotation of said carousel after etch removal of said edge portions, and removing said coin stacks from said carousel.

23. Method of etching the edges of a plurality of like semiconductor wafers of rectangular configuration for the purpose of removing micro-cracks at said edges, said method comprising assembling said plurality of wafers face-to-face in contact with each other so as to form a coin stack with the wafers having their edges in mutual alignment, providing a reaction chamber containing a plasma generator characterized by at least a pair of hollow gas discharge electrodes that are disposed adjacent one another and arranged so that gas streams discharged therefrom will converge on one another, forming an upwardly flowing re plasma stream comprising reactive halogen ions by discharging converging gas streams from said electrodes and energizing said electrodes so as to create an electric discharge between said converging gas streams while the pressure within said chamber is at the level of atmospheric pressure, said upwardly flowing reactive plasma stream comprising a first zone above and spaced from the region of said electrodes and said electric discharge that is characterized by a temperature in the order of 500° C. and a second zone below said first zone and proximate the region of said electrodes and said electric discharge that is characterized by a temperature substantially greater than the temperature of said first zone, positioning said coin stack in said chamber above said electrodes so that said wafers extend vertically and first edges of said wafers face down and extend to the level of said first zone but short of the level of said second zone, continuously moving said coin stack so that said first edges move in and out of said first zone repetitively and continuously with the time duration of each transit of said first edges in said first zone being limited so that said first edges are etched incrementally by reaction with said halogen ions, terminating movement of said coin stack and removing said coin stack from said chamber after said first edges have been exposed to said plasma gas stream for a period of time sufficient to etch away substantially all microcracks from said first edge and to limit the etching substantially to edge portions of said wafers, reorienting said coin stack and repositioning said coin stack in said chamber above said electrodes so that said wafers still extend vertically but other edges of said wafers face down, continuously moving said coin stack so that said other edges move in and out of said first zone repetitively and continuously with the time duration of said other edges in said first zone being limited so that said other edges are etched incrementally by reaction with said halogen ions, and then terminating movement of said coin stack and removing said coin stack from said chamber after said other edges have been exposed to said plasma gas stream for a period of time sufficient to etch away substantially all microcracks from said other edges and to limit the etching substantially to edge portions of said wafers.

24. Method according to claim 23 wherein said wafers are polycrystalline silicon wafers produced by the EFG process.

25. Method of edge etching a plurality of planar semiconductor wafers so as to remove edge portions thereof that are characterized by micro-cracks, said method comprising assembling said plurality of wafers in a plurality of coin stacks with the wafers in each stack being in face to face contact in edge alignment with one another, supporting said stacks on a carousel in an etching chamber, with said carousel having a vertical axis of rotation and said coin stacks disposed in a circular array centered on and spaced from said axis of rotation and with said wafers oriented so that they extend vertically and certain of their edge portions face downwardly, generating an upwardly flowing reactive plasma stream in a selected region of said chamber below said carousel and said coin stacks while maintaining the pressure within said chamber substantially at the level of atmospheric pressure, maintaining said plasma stream within said chamber at substantially atmospheric pressure, continuously rotating said carousel so that each stack in turn passes through said plasma stream with said selected edge portions of the wafers in said each stack repetitively contacting said plasma stream for a limited time in the order of milliseconds, whereby to etch said edge portions to eliminate said micro-cracks, terminating rotation of said carousel and removing said coin stacks from contact with said plasma stream after said micro-cracks have been eliminated and while the etching has been limited substantially to said edge portions.

26. Method according to claim 25 wherein said wafers are polycrystalline silicon wafers produced by the EFG process.

27. Method of edge etching a plurality of rectangular polycrystalline semiconductor wafers having first, second, third and fourth side edges defining a rectangular edge configuration for the purpose of removing edge portions thereof that have micro-cacks, said method comprising assembling said plurality of wafers face-to-face in contact with each other so as to form a coin stack with their edges in mutual alignment, creating an upwardly flowing reactive plasma stream in a reaction chamber at substantially atmospheric pressure by creating an electric discharge through at least two upwardly directed converging gas streams, maintaining said reactive plasma stream while maintaining the pressure within said chamber at substantially atmospheric pressure, positioning said coin stack in said chamber above the level of the region of said electric discharge with said wafers extending vertically and said first side edges facing down, continuously moving said coin stack horizontally in a circular path so that substantially said first side edges of said wafers are repetitively exposed to and are contacted by said reactive plasma stream above said region of electric discharge for a limited time duration during each cycle of movement thereof along said circular path, whereby said portions of said first side edges are etched away incrementally by said plasma, removing said coin stack from said chamber after etch removal of micro-cracks from said first side edges, repositioning said coin stack in said chamber above the level of the region of said electric discharge with said wafers extending vertically but said second side edges facing down, continuously moving said coin stack horizontally in a circular path so that substantially only said second side edges of said wafers are repetitively exposed to and are contacted by said plasma stream above said region of electric discharge for a limited time duration during each cycle of movement thereof along said circular path, whereby portions of said wafers along said second side edges are etched away incrementally by said plasma stream, removing said coin stack from said chamber after etch removal of micro-cracks from said second side edges, and repeating the foregoing process so that said third and fourth side edges in turn are repetitively exposed to and are contacted by said plasma stream above said region of electric discharge for a limited time duration, whereby edge portions with microcracks along said third and fourth side edges are etched away incrementally by said plasma.

28. Method according to claim 27 wherein etching is limited substantially to said edge portions.

* * * * *

UNITED STATES PATENT AND TRADEMARK OFFICE
CERTIFICATE OF CORRECTION

PATENT NO.    : 6,660,643 B1
DATED         : December 9, 2003
INVENTOR(S)   : Michael J. Kardauskas et al.

It is certified that error appears in the above-identified patent and that said Letters Patent is hereby corrected as shown below:

Column 12,
Line 53, change "a,-e" to -- are --.

Signed and Sealed this

Third Day of February, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,660,643 B1
DATED : December 9, 2003
INVENTOR(S) : Michael J. Kardauskas et al.

It is certified that error appears in the above-identified patent and that said Letters Patent is hereby corrected as shown below:

<u>Column 1,</u>
Line 3, insert the following paragraph:
-- This invention was made with Government support under NREL Subcontract No. ZAF-6-14271-13, Prime Contract No. DE-AC36-98GO10337 awarded by the Department of Energy. The Government has certain rights in this invention. --.

Signed and Sealed this

Sixth Day of September, 2005

JON W. DUDAS
*Director of the United States Patent and Trademark Office*